(12) United States Patent
Johnson

(10) Patent No.: US 6,549,059 B1
(45) Date of Patent: Apr. 15, 2003

(54) UNDERDAMPED JOSEPHSON TRANSMISSION LINE

(75) Inventor: Mark W. Johnson, La Canada Flintridge, CA (US)

(73) Assignee: TRW Inc., Redondo Beach, CA (US)

( * ) Notice: Subject to any disclaimer, the term of this patent is extended or adjusted under 35 U.S.C. 154(b) by 0 days.

(21) Appl. No.: 09/792,579

(22) Filed: Feb. 23, 2001

(51) Int. Cl.$^7$ .............................................. H03K 17/92
(52) U.S. Cl. ........................................ 327/367; 327/528
(58) Field of Search ................................ 327/367, 527, 327/528, 165, 186; 326/3, 4, 21, 22, 26; 257/31, 36; 365/162; 505/861, 874, 702, 832, 864–866; 333/99 S, 12, 15, 16, 17.1

(56) References Cited

U.S. PATENT DOCUMENTS

| | | | | |
|---|---|---|---|---|
| 4,012,642 A | * | 3/1977 | Gueret | 326/6 |
| 4,051,393 A | * | 9/1977 | Fulton | 327/367 |
| 4,554,567 A | * | 11/1985 | Jillie et al. | 357/5 |
| 5,146,119 A | * | 9/1992 | Kamikawai et al. | 326/3 |
| 5,233,244 A | * | 8/1993 | Suzuki | 326/4 |
| 5,334,884 A | * | 8/1994 | Tesche | 327/113 |
| 5,610,857 A | * | 3/1997 | Nandakumar | 365/162 |
| 5,629,889 A | * | 5/1997 | Chandra et al. | 365/162 |
| 5,844,407 A | * | 12/1998 | Hubbell | 324/72 |
| 5,936,458 A | * | 8/1999 | Rylov | 327/528 |
| 5,942,997 A | | 8/1999 | Silver et al. | 341/133 |
| 6,188,236 B1 | * | 2/2001 | Wikborg | 326/3 |
| 6,331,805 B1 | * | 12/2001 | Gupta et al. | 331/107 S |
| 6,483,339 B1 | * | 11/2002 | Durand et al. | 326/5 |

OTHER PUBLICATIONS

W. C. Stewart, "Current–Voltage Characteristics of Josephson Junctions", Applied Physics Letters, vol. 12, No. 8, Apr. 15, 1968, pp. 277–280.
D. E. McCumber, "Effect of ac Impedance on dc Voltage–Current Characteristics of Superconductor Weak–Link Junctions", Journal of Applied Physics, vol. 39, No. 7, Jun. 1968.
K. K. Likharev and V. K. Semenov, "RSFQ Logic/Memory Family: A New Josephson–Junction Technology Technology for Sub–Terahertz–Clock–Frequency Digital Systems", IEEE Transaction on Applied Superconductivity, vol. 1, No. 1, Mar. 1991, pp. 3–28.

* cited by examiner

Primary Examiner—Timothy P. Callahan
Assistant Examiner—Hai L. Nguyen
(74) Attorney, Agent, or Firm—Harness & Dickey & Pierce, P.L.C.

(57) ABSTRACT

A Josephson junction transmission line (50) for transmitting single flux quantum pulses. The transmission line (50) includes a current source (53), a plurality of isolation inductors (52, 54) electrically coupled in series along the transmission line (50), and a plurality of Josephson junction circuits (60, 70) electrically coupled in parallel along the transmission line (50). Each of the Josephson junction circuits (60, 70) includes only a Josephson junction (62, 72) and a parasitic inductor (64, 74) coupled in series. The Josephson junction circuits (60, 70) do not include a damping resistor in order to reduce timing uncertainty and to enhance propagation speed.

9 Claims, 3 Drawing Sheets

UNDERDAMPED JOSEPHSON TRANSMISSION LINE

BACKGROUND OF THE INVENTION

1. Field of the Invention

This invention relates generally to Josephson transmission lines, and more particularly, to Josephson transmission lines that employ underdamped Josephson junctions to enhance the speed of signal propagation.

2. Discussion of the Related Art

With recent developments in superconductor technology, superconductor devices based on Josephson Junctions effect are replacing conventional devices based on semiconductor technology for high performance and low power. Digital circuits that employ superconductor technology are often desirable because these devices can simultaneously consume very little power and operate at very high clock speeds as compared to their semiconductor counterparts. Because of low power consumption, it is possible to make systems very compact. Other benefits for signal transmission using superconducting devices include reduced signal attenuation and noise. Digital circuits that employ superconductor devices can operate at clock speeds exceeding 100 GHz.

Josephson transmission lines (JTL) are typically employed in superconductor digital circuits to manipulate and transmit narrow pulse width signals at low power. JTLs employ Josephson junctions at predetermined intervals along the transmission line that regenerate and transmit pulse signals as a single flux quanta (SFQ), or a single quanta of magnetic flux. The Josephson junction functions as a tunneling device that includes two opposing superconductive films, separated by an oxide dielectric layer. A current bias is applied to each Josephson junction. These junctions then switch or flip in response to an incoming transient voltage pulse, regenerating that pulse for the next junction, and returning to their initial state where they are ready to respond to the next pulse. Each Josephson junction generates a voltage pulse when it switches. Typical SFQ pulse signals generated by a Josephson junction are 2–3 ps in width and 1 mV. The time integral of the voltage pulse is equal to a single quanta of magnetic flux $\Phi_0 = 2.07 \times 10^{-15}$ Volt-seconds.

FIG. 1 is a schematic diagram of a standard superconducting Josephson transmission line (JTL) 10 that is representative of the known transmission lines of this type. The JTL 10 is comprised of a sequence of JTL segments 11. The JTL segment 11 includes an inductor 16 connecting adjacent junctions, a resistively shunted junction circuit 18 connecting one end of inductor 16 to a common ground return, and a biasing resistor connected between the top of the junction 18 and a current source 12. The isolation inductor 16, provides inductive isolation between adjacent junctions 11 and allow propagation of the SFQ pulse along the JTL 10. The biasing resistor 14 is connected in series with a current source 12 which provides an equal amount of current to each of the Josephson junction circuits 18 and 20.

The Josephson junction circuits 18 and 20 of the JTL 10 are spaced apart at predetermined intervals along the JTL 10 and act to regenerate the SFQ pulses at each stage. Each Josephson junction circuit 18 and 20 is shown as an equivalent circuit of a resistor and Josephson junction in a parallel array. The equivalent elements of the JTL segment 11 and the Josephson junction circuit 18 will be described with the understanding that all of the Josephson junction circuits in the JTL 10 have the same elements. The Josephson junction circuit 18 includes a Josephson junction 22 that is connected in series with a first parasitic inductor 24. The Josephson junction 22 and the first parasitic inductor 24 are connected in parallel with a damping resistor 26 and a second parasitic inductor 28. The first and second parasitic inductors 24 and 28 are connected to a reference ground 30 opposite the Josephson junction 22 and the damping resistor 26. The damping resistor 26 shunts the Josephson junction 22 and helps to define its response to incoming signals. The damping resistor 26 is chosen such that the Stewart-McCumber parameter [W. C. Stewart, *Applied Physics Letters* 12, 277 (1968). D. E. McCumber, *Journal of Applied Physics* 39, 3113 (1968)], which parameterizes how a Josephson junction is damped, falls between 1 and 2.

When an SFQ pulse impinges the JTL segment 11, the Josephson junction 22 flips, or increments its internal degree of freedom, or phase by $2\pi$. When the Josephson junction 22 flips, the Josephson junction 22 regenerates and transmits an SFQ pulse to the next junction. When the next junction receives the SFQ pulse, it recreates and propagates the SFQ pulse to the following junction. Typically, the travel time of the SFQ pulse from one Josephson junction to the other ranges between 2.5–4 picoseconds(ps) depending on the degree of damping (Stewart-McCumber parameter) and the current bias. At any given time, at least two junctions are in the process of advancing their phase.

When the junction flips, the Josephson junction 22 regenerates a voltage pulse having a fixed time integral $\Phi_0$. In cases where the junction carries current that is less than a predetermined threshold, the Josephson junction does not flip in response to the input pulse and fails to regenerate and retransmit the voltage pulse to the next junction. On the other hand, when the junction carries current that exceeds a predetermined threshold, the Josephson junction goes into a voltage state where it emits a pulse train, or multiple voltage pulses in rapid succession although only one pulse is expected, and leads to erroneous results of a circuit. Damping resistor 26 helps to prevent JTL 10 from going into the voltage state. Conventionally the magnitude of the inductance of the isolation inductor 16 is such that the product of its inductance and the Josephson junction's critical current (the $L$-$I_c$ product) is in the range 0.7–1.0 milliAmp-picoHenrys. In addition, each junction 11 is current biased with about 60%–80% of the critical current of the Josephson junction.

Furthermore, as the SFQ pulse is transmitted down the JTL 10, the damping resistor 26 generates Johnson noise, or current noise that effects the junction 22. Because the speed of propagation depends upon the applied current bias, the current noise results in timing jitter, or uncertainty in the time of flight of the SFQ pulse. Additionally, because the Johnson noise applied to each junction 22 is independent with respect to the other junction 11, the timing jitter of each junction 22 is also independent with respect to the other junction. The accumulation of this timing jitter in the JTL 10 increases in proportion to the square root of the number of JTL segments 11 in JTL 10. The damping provided by the damping resistor 26 and the first and second parasitic inductors 24 and 28 increases the propagation delay and results in a slower speed of signal propagation on a chip as could otherwise be realized. The propagation speed of an SFQ pulse along JTL 10 is about one tenth of the propagation speed along a passive microstrip transmission line fabricated in the same superconducting integrated circuit (IC) technology. Therefore, the standard JTL 10 available for SFQ based devices is slow, and adds timing jitter or timing uncertainty to the signal it carries. This timing uncertainty ultimately limits the maximum clock speed of the clocked logic circuits and the performance of superconducting devices that employ Josephson junction transmission lines.

What is needed is a superconductor Josephson transmission line that provides the transmission and distribution of the SFQ pulses on a superconducting integrated circuit without suffering from the drawbacks discussed above. It is therefore an object of the present invention to provide a superconducting Josephson transmission line that transmits the SFQ pulses at faster speeds with reduced timing jitter.

SUMMARY OF THE INVENTION

In accordance with the teachings of the present invention, a Josephson transmission line (JTL) for transmitting single flux quantum pulses is provided. The JTL includes a current source, a plurality of isolation inductors electrically coupled in series along the JTL, and a plurality of Josephson junction circuits electrically coupled in parallel along the JTL. Each of the Josephson junction circuits includes a Josephson junction and a parasitic inductor coupled in series. However, the Josephson junction circuits do not include any damping elements. This enables the JTL to reduce timing uncertainty and to enhance propagation speed. In one embodiment, each Josephson junction circuit is biased with about 30% of the critical current of the Josephson junction and the inductance of the isolation inductor is adjusted between 0.2–0.4 pHmA/IC, where IC is the critical current in mA of the Josephson junction. The reduced current bias and inductance of the isolation inductor help prevent the transmission line from going into a voltage state in the absence of damping resistors. The present invention, thus, provides a superconducting Josephson transmission line that transmits and distributes the SFQ pulses at faster speeds with reduced timing jitter.

Additional objects, advantages and features of the present invention will become apparent to those skilled in the art from the following discussion and the accompanying drawings and claims.

DETAILED DESCRIPTION OF THE PREFERRED EMBODIMENTS

Figure 1:
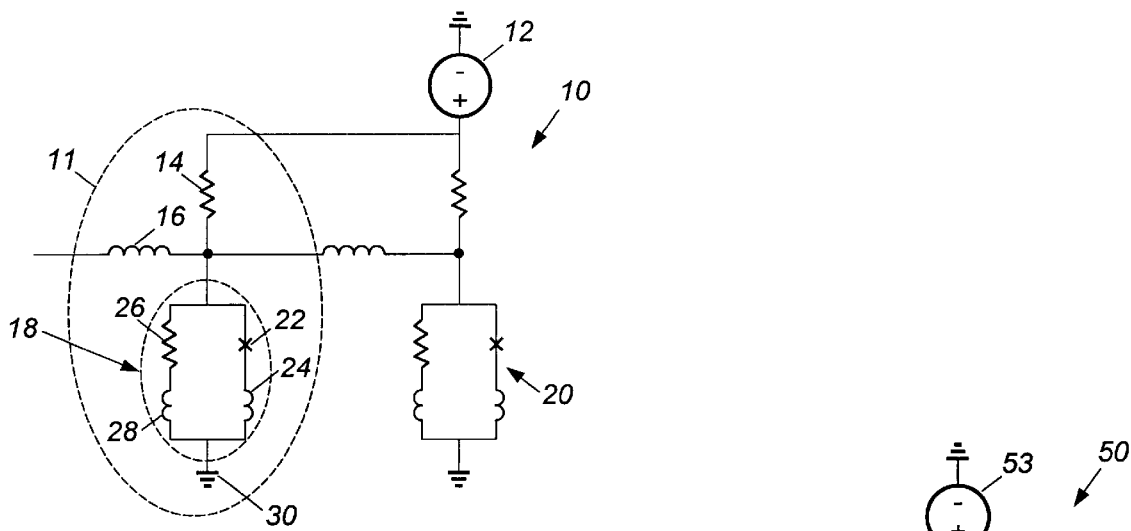
FIG. 1 is a schematic diagram of a known superconductor Josephson junction transmission line.
Figure 2:
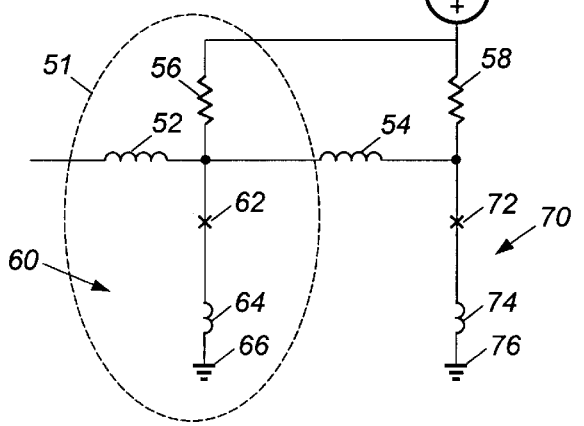
FIG. 2 is a schematic diagram of an underdamped superconductor Josephson junction transmission line, according to an embodiment of the present invention.

The following discussion of the preferred embodiments, directed to a Josephson transmission line for transmitting single flux quantum pulses, is merely exemplary in nature, and is in no way intended to limit the invention or its application or FIG. 2 is a schematic diagram of an underdamped superconductor Josephson transmission line (JTL) 50, according to an embodiment of the present invention, that transmits and distributes SFQ signal pulses in a superconducting integrated circuit in the manner discussed above. The underdamped JTL 50 includes a plurality of JTL segments 51 that are connected in series. The JTL segments 51 include a series of Josephson junction circuits 60 and 70 connected in parallel between a reference ground 66 and 76 and a biasing resistor 56 and 58 along the JTL 50 at predetermined intervals. The biasing resistors 56 and 58 are connected in series with a current source 53 which distributes an equal amount of current to each junction 51 through bias resistors 56 and 58. Isolation inductors 52 and 54 are connected in series along the underdamped JTL 50 between adjacent junctions 62 and 72. The isolation inductors 54 and 56 allow propagation of the SFQ pulses and provide inductive isolation between the Josephson junction circuits 60 and 70. The Josephson junction circuits 60 and 70 include a parasitic inductor 64 and 74, and a Josephson junction 62 and 72 connected in series, respectively. The Josephson junction circuits 60 and 70 do not include a damping resistor or a parasitic inductor that are connected in parallel as do the Josephson junction circuits 18 and 20 discussed above.

By eliminating the damping resistor 26, the junction 62 is left with a damping resistance intrinsic to the junction 62 which is much weaker than that in the standard JTL. With less resistive damping, Josephson junctions 62 and 72 will flip in response to an incoming SFQ pulse with less applied current bias compared to the conventional JTL 10. By eliminating the damping resistor 26, the underdamped JTL 50 also has reduced Johnson noise, or current noise, and thus reduced timing jitter is added by JTL segment 51. Removing the damping resistor reduces the time it takes Josephson junctions 62 and 72 to flip in response to an incoming SFQ pulse. Therefore SFQ pulses propagate more quickly from one junction to the next in the underdamped JTL 50 than they do in the conventional JTL 10.

In the present invention, each Josephson junction 62 and 72 is current biased at about 30% of their critical current, and the LIC product is adjusted between 0.2–0.4 pHmA for the underdamped JTL 50. As discussed above, each junction 11 of the standard JTL 10 is current biased with 60% of the critical current of the Josephson junction 22 and the LIC product is adjusted between 0.6–0.8 pHmA/IC. If the damping resistors 26 are removed from the conventional JTL 10, it will tend to go into the voltage state in response to an incoming SFQ pulse, producing many SFQ output pulses, and rendering the JTL unusable. This problem is avoided in the underdamped JTL by reducing the bias current from around 60% to 30% of the Josephson junction's critical current, and reducing the LIC product to the range 0.2–0.4 milliAmp-picoHenrys. Thus, in the present invention, the LIC product, or the magnitude of the inductance of the isolation inductor 52, 54 is adjusted between 0.2 and 0.4 pHmA/IC(mA), and more preferably at 0.3 pHmA/IC(mA). For example, when the critical current of the Josephson junction 62 is 0.1 mA, the inductance of the isolation inductor 52 is chosen to be 3 pH.

Figure 3:
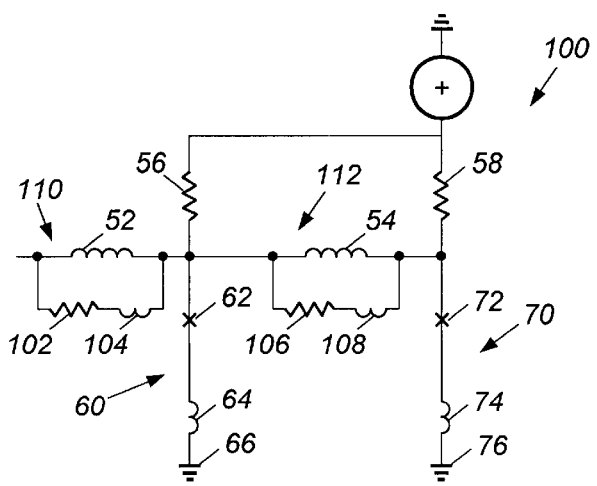
FIG. 3 is a schematic diagram of an underdamped superconductor Josephson junction transmission line that employs resistively shunted inductors, according to another embodiment of the present invention.

FIG. 3 is a schematic diagram of an underdamped JTL 100 according to another embodiment of the present invention. The underdamped JTL 100 includes all of the elements of the underdamped JTL 50 where the same elements are represented by the same reference numeral. Additionally, the JTL 100 includes a damping resistor 102 and 106 and a parasitic inductor 104 and 108 in parallel with the inductors 52 and 54, respectively, and defines a shunted inductor 110 and 112. The shunted inductors 110 and 112 allow the Josephson junctions 62 and 72 in JTL 100 to be biased at a higher fraction of their critical current than their counterparts in JTL 50. The damping resistors 102 and 106 help prevent JTL 100 from going into the voltage state in response to an input SFQ pulse, and thus have the effect of increasing the range of allowable bias current for JTL 100 relative to JTL 50. While damping resistors 102 and 106 do apply Johnson noise current to Josephson junctions 62 and 72 in JTL 100, they do so in a way that adds less timing jitter to propagating SFQ pulses than do the damping resistors 26 in the conventional JTL 10.

Figure 4:
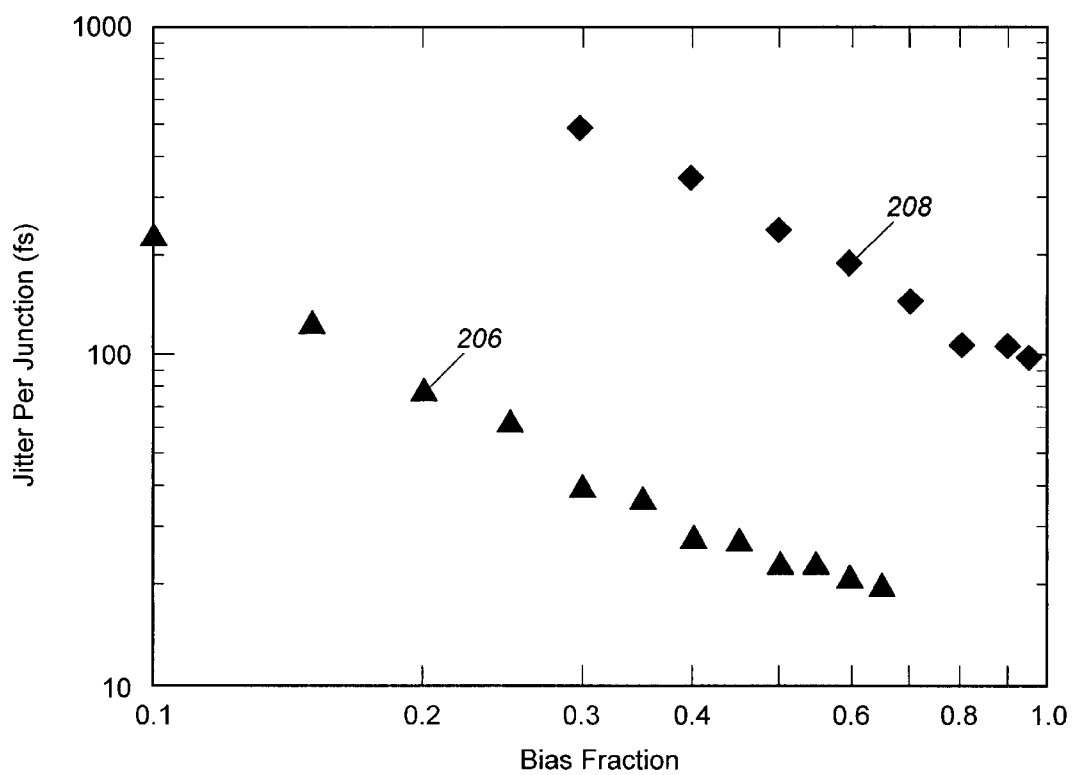
FIG. 4 is a graph showing illustrative simulation plots depicting the relationship between the timing jitter present per junction and the bias fraction for the standard and underdamped Josephson junction transmission lines.

FIG. 4 is an illustrative graph comparing the amount of timing jitter present per junction in the standard JTL 10 and the underdamped JTL 100 of FIG. 2 when the current bias is varied. The vertical axis represents the timing jitter contributed per junction in femtoseconds, and the horizontal axis represents the fraction of maximum current bias. A graph line 206 represents the timing jitter per junction of the underdamped JTL 50, and a graph line 208 represents the timing jitter per junction of the standard JTL 10. The lines 206 and 208 show that the underdamped JTL 50 contains less timing jitter per junction than the standard JTL 10 when the same fraction of current bias is applied. When the fraction of bias current is varied from 0.1 (10%) to 0.7 (70%), the timing jitter in the underdamped JTL 50 drops from 200 fs to 20 fs. For the standard JTL 10, the timing jitter drops from 600 fs to 100 fs when the fraction of bias current changes from 0.3 (30%) to 1.0 (100%). The timing jitter per junction for the standard JTL 10 is, on average, ten times more than that of the underdamped JTL 50 when the same amount of bias current is applied.

FIG. 4 also illustrates that for both the standard and underdamped JTLs 10 and 50, the less fraction of current bias applied, the more timing jitter is present per junction. Also, the more fraction of current bias applied, the less timing jitter is present per junction for both the standard and underdamped JTLs 10 and 50. However, as mentioned above, junctions in JTLs 10, 50 and 100 will go into a voltage state, in which many output SFQ pulses may be produced in response to a single input SFQ pulse, when current bias applied to each junction exceeds a predetermined fraction of its critical current. Likewise when the current bias applied to each junction falls below some predetermined fraction of its critical current, too much timing jitter is added as the SFQ pulse propagates from one junction to the next. In this limit the transmission and distribution of SFQ pulses is unreliable. In the present invention, about 30% of bias current is applied to each junction.

Figure 5:
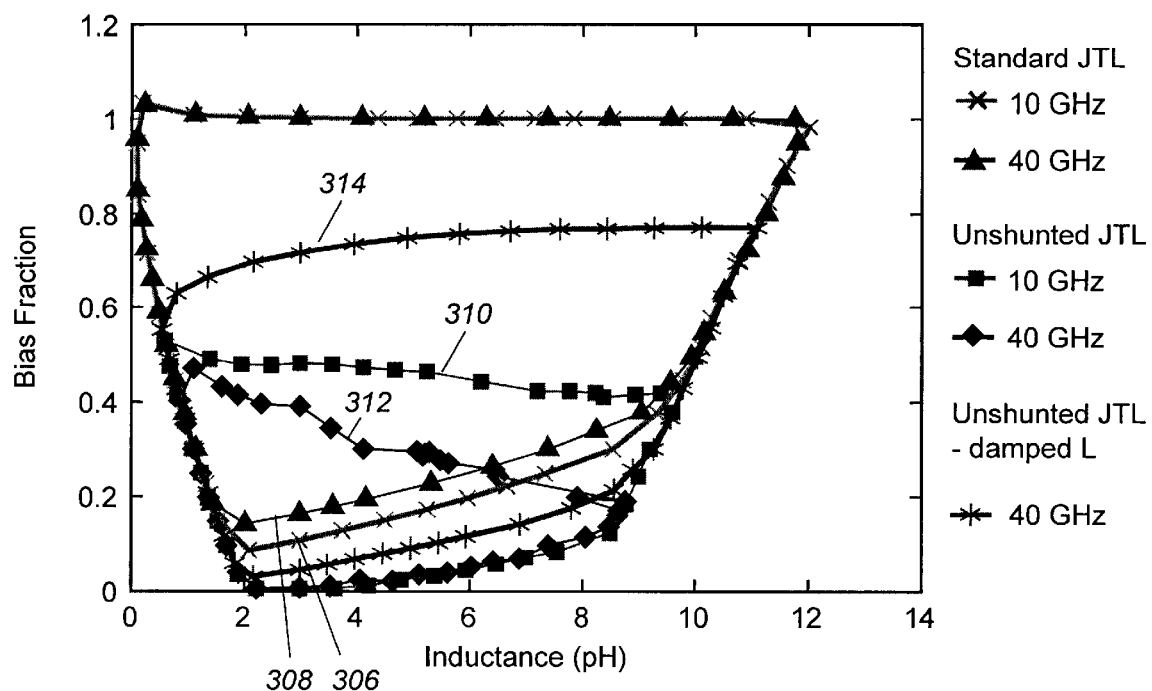
FIG. 5 is a graph showing illustrative simulation plots depicting the difference in the operating margins for the standard Josephson junction transmission line, the underdamped Josephson junction transmission line, and the underdamped Josephson junction transmission line with damping on the inductor.

FIG. 5 is a graph illustrating the operating margins of bias current for the above mentioned JTLs 10, 50 and 100 when the critical current of the Josephson junction is set at 0.1 mA. The vertical axis represents the fraction of maximum bias, and the horizontal axis represents the inductance between adjacent junctions in pico-Henry (pH). First and second plots 306 and 308 represent the operating ranges of the standard JTL 10 for 10 giga-hertz (GHz) and 40 GHz data pulse trains, respectively, as a function of both inductance and bias fraction. Third and fourth plots 310 and 312 represent the operating ranges of the underdamped JTL 50 for 10 GHz and 40 GHz data pulse trains, respectively. Fifth plot 314 represents the operating range of the underdamped JTL 100 with the shunted inductor junctions for a 40 GHz data pulse train. The third plot 310 illustrates that when the inductance is set at 4 pH, the bias fraction must be set between 0.05 and 0.48 for the underdamped JTL 50 to correctly transmit and to distribute 10 GHz data pulse train. If the bias fraction is set at 0.3, then the inductance must be set between 2 to 8 H for the underdamped JTL 50 to properly function.

FIG. 5 also illustrates that the bias fractions of the first and second plots 306 and 308, respectively, are almost twice as high as that of the third and fourth plots 310 and 312 when the inductance is varied from 0 to 11.5 pH. This implies that the underdamped JTL 50 requires only 50% of the current bias to properly function when compared to that of the standard JTL 10. Furthermore, the fifth plot 314 illustrates the enlarged operating margin of the underdamped JTL 100 when the shunted inductor junctions 110 and 112 are employed. The bias fraction is required to be set between 0.05 to 0.3 when the underdamped JTL 50 uses the inductance 4 pH for a 40 GHz pulse train as shown by the fourth plot 312. However, the bias fraction maybe set anywhere between 0.1 to 0.7 when the underdamped JTL 100 with the shunted inductor uses the same amount of inductance for the same pulse train as illustrated by the fifth plot 314. This enlarged operating margin of the underdamped JTL 100 with the shunted inductor shares the advantages of reduced timing jitter and increased propagation speed afforded by underdamped JTL 50, but with an increased bias current operating margin.

The present invention solves the aforementioned problems by removing the damping resistor from the Josephson junction circuit which reduces the amount of noise current injected into the Josephson junction from the resistor. This, in turn, reduces the accumulated timing uncertainty added in signal transmission. Because the Josephson junction is not damped as strongly, the phase of the junction advances more rapidly, and the SFQ pulses propagate fast along the transmission line. The present invention is applicable to circuits/devices where the SFQ signals are transmitted around a superconducting IC. For example, the present invention may be used to reduce jitter in superconducting A/D converters which is disclosed in U.S. Pat. No. 5,942,997, issued Aug. 24, 1999, titled "Correlated Superconductor Single Flux Quantum Analog-to-Digital Converter", and assigned to the same assignee as the present invention. In addition, the present invention may also be used in digital logic applications where timing jitter between clock and data signals limits the maximum clock rate.

The foregoing discussion describes merely exemplary embodiments of the present invention. One skilled in the art would readily recognize that various changes, modifications and variations can be made therein without departing from the spirit and scope of the invention as defined in the following claims.

What is claimed is:

1. A Josephson junction transmission line for transmitting single flux quantum pulses, said transmission line comprising:

a current source;

a plurality of isolation inductors electrically coupled in series along said transmission line;

damping elements coupled in parallel with each isolation inductor; and a plurality of Josephson junction circuits electrically coupled in parallel along said transmission line, each junction circuit including a Josephson junction, wherein each Josephson junction is biased with about 30% of a critical current of the Josephson junction in order to prevent said transmission line from going into a voltage state.

2. The transmission line of claim 1 wherein said damping elements include a damping resistor and a parasitic inductor.

3. A Josephson transmission line for transmitting single flux quantum pulses, said transmission line comprising:
   a current source;
   a plurality of isolation inductors electrically coupled in series along said transmission line; and
   a plurality of Josephson junction circuits electrically coupled in parallel along said transmission line, each Josephson Junction circuit being biased with current from said current source, wherein each Josephson junction circuit includes a Josephson junction having an underdamped response characteristic for providing reduced current noise and reduced timing uncertainty to increase the pulse propagation speed.

4. The transmission line of claim 3 wherein said damping components include a damping resistor and a parasitic inductor connected in series.

5. The transmission line of claim 3 wherein each Josephson Junction circuits is current biased with about 30% of a critical current of said Josephson junction for preventing said transmission line from going into a voltage state.

6. The transmission line of claim 3 wherein a magnitude of an inductance of said isolation inductor as adjusted between 02.–0.4 pHmA/IC(mA), where IC(mA) is a critical current of the Josephson junction, to prevent said transmission line from going into a voltage state.

7. A Josephson junction transmission line for transmitting single flux quantum pulses, said transmission line comprising:
   a current source;
   a plurality of isolation inductors electrically coupled in series along said transmission line; and
   a plurality of Josephson junction circuits electrically coupled in parallel along said transmission line, each junction circuit including a Josephson junction, wherein each Josephson junction is biased with about 30% of a critical current of the Josephson junction in order to prevent said transmission line from going into a voltage state.

8. The transmission line of claim 7 wherein a magnitude of an inductance of said isolation inductor is adjusted between 0.2–0.4 pHmA/IC, wherein IC is a critical current of said Josephson junction in mA.

9. The transmission line of claim 7 wherein each Josephson junction circuit consists of only the Josephson junction and a parasitic inductor.

* * * * *